United States Patent [19]
Silvestri et al.

[11] Patent Number: 4,728,624
[45] Date of Patent: Mar. 1, 1988

[54] SELECTIVE EPITAXIAL GROWTH STRUCTURE AND ISOLATION

[75] Inventors: Victor J. Silvestri, Hopewell Junction; Paul J. Tsang, Poughkeepsie, both of N.Y.

[73] Assignee: International Business Machines Corporation, Armonk, N.Y.

[21] Appl. No.: 793,612

[22] Filed: Oct. 31, 1985

[51] Int. Cl.[4] .................. H01L 21/22; H01L 21/20
[52] U.S. Cl. ........................ 437/90; 437/225; 437/31; 437/33; 156/647
[58] Field of Search ............. 29/576 E, 576 W; 357/43; 156/647; 148/DIG. 26, DIG. 25, DIG. 50

[56] References Cited

U.S. PATENT DOCUMENTS

| | | | |
|---|---|---|---|
| 3,370,995 | 2/1968 | Lowery et al. | 148/DIG. 50 |
| 3,796,613 | 3/1974 | Magda et al. | 357/43 |
| 3,865,649 | 2/1975 | Beasam | 357/43 |
| 3,938,176 | 2/1976 | Sloan, Jr. | 29/576 E |
| 4,252,582 | 2/1981 | Anantha et al. | 29/576 W |
| 4,299,024 | 10/1981 | Piatrowski | 357/43 |
| 4,546,536 | 10/1985 | Anantha et al. | 29/576 W |

FOREIGN PATENT DOCUMENTS

| | | | |
|---|---|---|---|
| 159348 | 9/1983 | Japan . | |
| 0117664 | 6/1985 | Japan | 357/34 |

OTHER PUBLICATIONS

Nakamura, T. et al., "Self Aligned Transistor with Sidewall Base Electrode" IEEE Transactions on Electron Devices, vol. ED-29, #4, Apr. 1982, pp. 596-600.

Dumke, W. "Bipolar Isolation Technique" IBM Technical Disclosure Bull., vol. 22, #7, Dec. 1979, pp. 2946-2947.

Primary Examiner—Brian E. Hearn
Assistant Examiner—Kevin McAndrews
Attorney, Agent, or Firm—Sughrue, Mion, Zinn, Macpeak, and Seas

[57] ABSTRACT

A novel method of employing selective epitaxial growth, in which interdevice isolation is intrinsically formed. Problems stemming from formation of all active device elements within selective epitaxial growth regions are addressed. Additionally, there is shown a novel transistor array formed according to the method of the invention.

10 Claims, 26 Drawing Figures

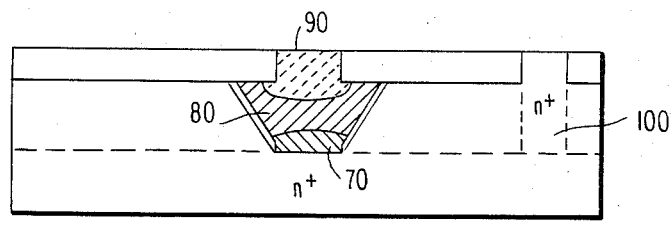
FIG.1(g)
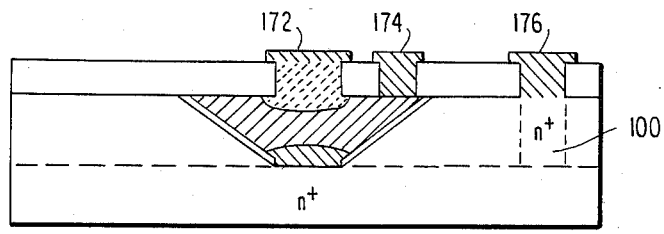
FIG.1(h)
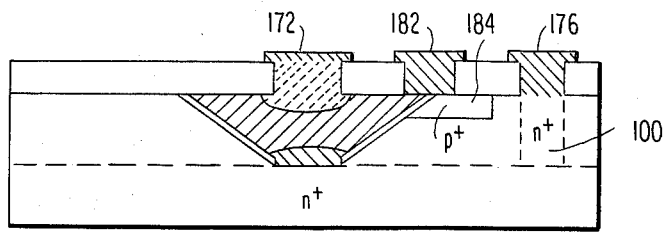
FIG.1(i)
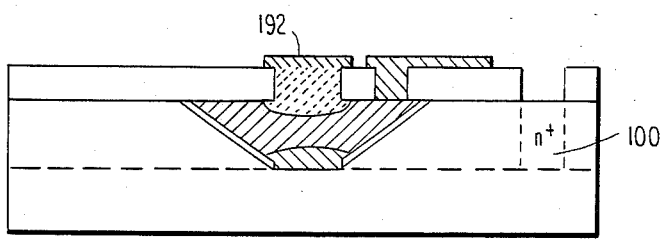
FIG.1(j)
FIG.2
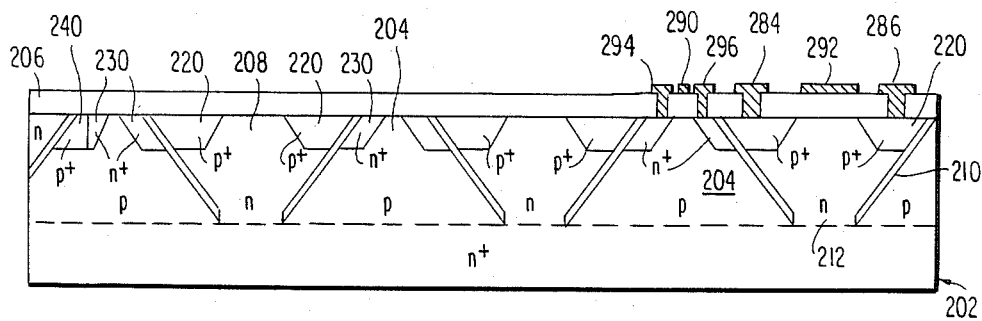

SELECTIVE EPITAXIAL GROWTH STRUCTURE AND ISOLATION

BACKGROUND OF THE INVENTION

The invention relates to a novel method of semiconductor device fabrication employing selective epitaxial growth, in which interdevice isolation is formed as an integral part of the process, rather than as a separate formation step. One aspect of this process is that at least one of the active elements of the resultant structure is formed before the isolation layer, and may exist both inside and outside the selective epitaxial growth regions.

DESCRIPTION OF THE PRIOR ART

Interdevice isolation is an important aspect of integrated circuit fabrication, as it is vitally important to prevent the occurrence of such phenomena as parasitic capacitances. Formerly, various approaches to such isolation have been employed. In U.S. Pat. No. 4,357,622, recessed oxide isolation (ROI) techniques were employed to provide isolation regions surrounding transistors in a complementary NPN/PNP structure. This technique makes achieving a compact structure difficult.

In another approach, isolation trenches were etched in a monocrystalline Si substrate, and lined with oxide. In this instance, the oxide layer formation was a separate process step. Further, the trenches did not constitute active elements of the devices, and the active elements of the devices were not formed in the trenches. Rather, the trenches themselves, and the oxide filling, provided the interdevice isolation. As a result, considerable space was wasted on a substrate.

An example of this approach may be found in I. Antipov and C. G. Jambotkar, "Post Emitter Polysilicon Trench Isolation," IBM Tech. Disc. Bull., July 1982 pp. 588–589. In this disclosure, trenches were lined with oxide and nitride, and refilled with polysilicon. This resulted in quite a deep structure, which was necessary to prevent the sideways flow of electric charge between adjacent devices on the substrate. U.S. Pat. No. 4,159,915 also exemplifies this approach. In the patent, deep isolation regions were formed surrounding individual transistors in a array. Again, a deep structure resulted. Also, the overall structure occupied considerable space on the substrate.

Other attempts to provide proper interdevice isolation have included trench isolation alone, without oxide lining or ROI. This solution has been difficult to implement.

Selective epitaxial growth, in which active elements of devices are formed within etched regions in an oxide layer, the surrounding oxide providing the required isolation, has been used for a number of years. Attempts have been made to apply this technique to vertical transistor structures, which take up less of the available surface area on a substrate, and also to symmetrical transistor structures.

Prior attempts to form such structures, not employing selective epitaxial growth, may be found in Reisman et al., "Methods for Making Symmetrical Transistor Structures," IBM Tech. Disc. Bull., Dec. 1982, pp. 3357–3363, and in U.S. Pat. No. 4,214,315 (vertical transistor structures). In the patent, deep, separately-formed isolation regions surrounded individual transistors.

In the past, selective epitaxial growth has been employed to form all active elements of a device, including a subcollector, within the etched regions in the oxide layer. U.S. Pat. No. 4,400,411 shows such a structure. However, autodoping and other problems arise when the subcollectors are selectively epitaxially grown in this manner.

SUMMARY OF THE INVENTION

Accordingly, it is an object of the present invention to avoid the problems of the prior art caused by the formation of all active elements of an integrated circuit device by selective epitaxial growth within an etched region in an oxide layer. It is another object of the invention to provide a process for fabricating a transistor array wherein interdevice isolation is intrinsically formed.

A still further object of the invention is to provide a symmetrical transistor structure with built-in interdevice isolation. It is yet another object of the present invention to provide a more compact structure for transistor arrays. It is a further object of the invention to provide a vertically self-aligned structure for a bipolar device wherein the device junctions are of equal size. Yet another object of the invention is to provide an improved base contact structure in a bipolar transistor array.

In accordance with these and other objects, a method for forming integrated circuit devices is described in which interdevice isolation is intrinsically formed, and in which at least one active element is formed outside an epitaxial growth region of each device. The method may be applied to formation of CMOS, complementary NPN/PNP structures, and bipolar transistor structures, and is particularly useful with regard to obtaining bipolar device junctions of equal size, thereby enhancing device performance.

Repetition of this method yields a plurality of symmetrical transistor structures in an array. In addition, an array is disclosed whose elements have a symmetrical transistor structure, in which the device elements are vertically self-aligned, in which the device junctions are of equal size, and which is more compactly isolated than previously was possible.

BRIEF DESCRIPTION OF THE DRAWINGS

The invention will be described in detail below with reference to the accompanying drawings, in which:

FIGS. 1(a)–(j) illustrate a first type of structure employing the method of the invention, and individual formation steps;

FIG. 2 shows an array formed of elements according to the structure and method shown in FIG. 1;

DETAILED DESCRIPTION OF THE PREFERRED EMBODIMENTS

Figure 1A:
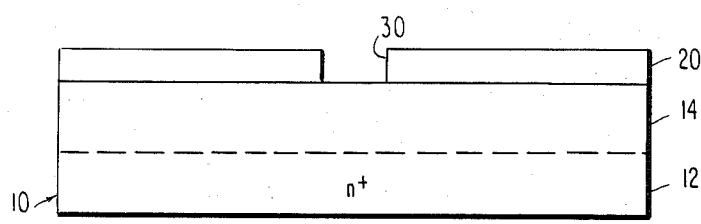

FIGS. 1(a)–(f) show formation steps for a first type of structure according to the invention. In FIG. 1(a), a monocrystalline silicon substrate 10 has a lower portion 12 which is doped n+ to a concentration in a range from $5 \times 10^{19} - 2 \times 10^{20}/cm^3$, and an upper portion 14 which is doped in accordance with the type of device to be formed. For example, if an n-channel MOS structure is to be formed, the upper portion 14 would be doped p, to a concentration of from $10^{14}$ to $3 \times 10^{16}/cm^3$. If an NPN bipolar structure is preferred, the upper portion 14 would be doped n−, to a particular concentration (for example, in a range from $10^{15}$ to $5 \times 10^{16}/cm^3$) in accordance with desired device characteristics. Also, the upper portion 14 may be formed as an epitaxial layer, separate from the lower portion 12. The lower portion 12 forms the subcollector region for the devices to be formed. In addition, the lower portion 12 could be a buried subcollector in a more highly resistive Si substrate.

At this point, it should be noted that, throughout this specification, preferred ranges of dopant concentrations have been set forth. Further, the ordinarily skilled artisan, being familiar with a wide range of doping techniques, would be able to employ the appropriate technique without undue experimentation, given the concentration ranges.

An oxide overlayer 20, which may be from 200 nanometers to two microns thick, is grown over the upper portion 14 by conventional methods. An emitter oxide opening 30 also is formed anisotropically by known techniques. When a plurality of devices are to be fabricated, as shown in FIG. 2, multiple openings are formed. These openings will be used to direct a reactive ion etching (RIE) step, to be performed later, for ensuring self alignment of the vertical transistor structure to be formed.

Figure 1B:
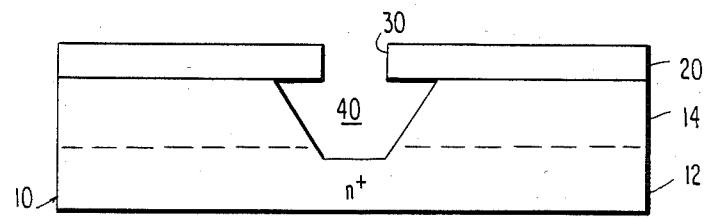

FIG. 1(b) shows a crevice 40, etched out of the upper portion 14 down to the lower portion 12 by plasma or wet etching, preferably by anesotropic etching The crevice 40 may extend into the subcollector region 12, as shown in this Figure, though not shown as such in FIGS. 1(c)-1(j). Generally, the crevice 40 preferably will have the shape shown in FIGS. 1(b)-(j) and FIG. 2, that is, a trapezoidal shape, having a flat lower surface. If plasma etching is used, the sides of the crevice 40 may be curved. A rectangularly-shaped crevice also may be etched.

The device will be formed within the crevice 40 with the subcollector region 12 outdiffusing into the overall structure, as will be described below, the crevice 40 constituting an active device region. The size of this region may vary, depending on the width of the hole 30, and on the desired width of the base to be formed, and on the size of the epi growth within. Actually, the desired base width will be the overall determinative factor, as the size of the epi growth will depend on the base width chosen.

Figure 1C:
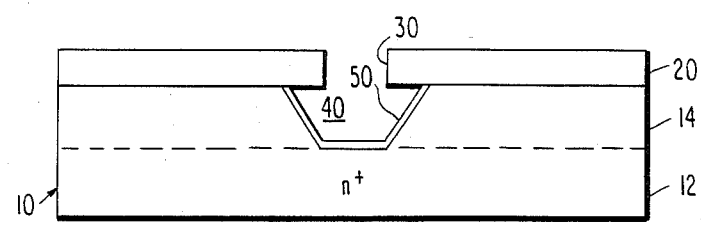

In FIG. 1(c), an oxide layer 50, which may be thermal SiO$_2$, is grown on the inner surface of the crevice 40. The desired thickness may vary between 20 and 300 nanometers, in accordance with the desired operating characteristics of the device and the degree of isolation required. The oxide layer may be quite thin, thereby enabling a more compact structure than was possible before. Also, more than one layer may be grown, the additional layer or layers being nitride (yielding an oxide/nitride combination) or other appropriate insulator. The layer or layers are effective in preventing parasitic capacitances.

Figure 1D:
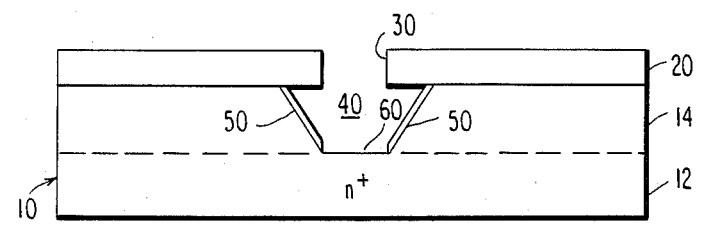

RIE then is performed on the oxide layer 50, as shown in FIG. 1(d), through the emitter opening 30 formed in the oxide overlayer 20, to open a self-aligned collector hole 60 in an anisotropic manner in the oxide layer 50. In this manner, the subcollector region 12 makes contact with the other active elements of the overall device. The collector hole 60 formed in this manner should have the same size as the emitter opening 30.

Figure 1E:
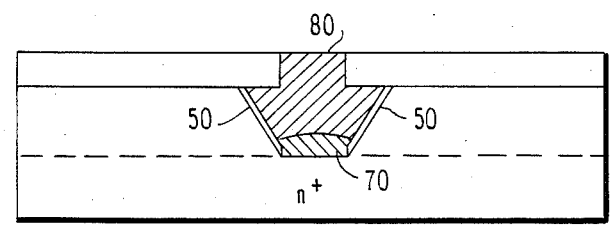

After the RIE step, the crevice 40 is refilled using selective epitaxial techniques. As shown in FIG. 1(e), after the collector hole 60 is opened, a collector 70 is outdiffused from the subcollector 12 by enabling expansion of the subcollector material 12 into the crevice 40. At this point, planar diffusion or ion implantation can be added to augment the dopant concentration of the collector 70. If this is needed, preferably it would be performed before the selective epitaxy is carried out.

Figure 1F:
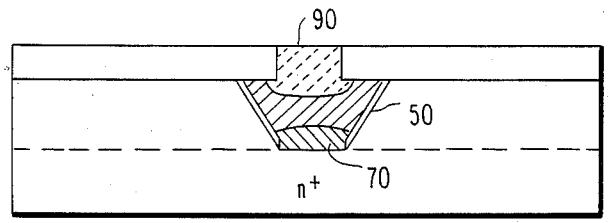

Finally, p-type silicon 80 is grown within the crevice to provide a base for the device. In FIG. 1(f), an n+ emitter 90, having a concentration of $5 \times 10^{19} - 2 \times 10^{20}/cm^3$, is formed within the p-type epi structure 80, either through diffusion or through ion implantation.

In the overall device, the width of the base region between the collector-base and base-emitter junctions may be from 0.1–0.5 microns, again depending on desired device characteristics. It should be noted that the procedure described thus far results in the above-mentioned junctions having equal areas—an important consideration in device fabrication, in addition to the resulting self-aligned structure. The junction areas are defined, respectively, by the emitter opening and the collector opening, which have equal dimensions.

Also, it should be noted that the p-type epi material 80 within the crevice 40 may be selectively epitaxially grown in a single step, and the collector simultaneously formed by outdiffusion expansion of the subcollector 12 during the epitaxial growth process. Alternatively, the collector, base, and emitter may be grown, in separate steps, by any appropriate technique, such as ion implantation or diffusion.

FIG. 1 (g) shows the formation of an n+ subcollector reach-through 100 for the device. The reach-through has the same concentration as the subcollector region 12, in order to facilitate contact on the same major surface of the overall device as the remainder of the contact structure, which will be described in greater detail below.

FIGS. 1(h)-(j) show alternative base contact structures which the inventive device and formation method enable. Because of the dish-like shape of the crevice 40, base contacts may be made on the surface of the wafer, thereby enabling connection of the device to other active elements in an array on the surface, instead of having buried contacts, as was the case previously.

In FIG. 1(h), an extrinsic base contact 174 is formed through the oxide layer 20. Also, an emitter contact 172 is formed, as well as a contact 176 for the subcollector reachthrough 100.

Alternatively, in FIG. 1(i), an overlapping contact 182 connects the region 80 with a p+ region 184 grown at a prior stage by diffusion or ion implantation under the oxide layer 20 and in the upper portion 14 of the substrate 10. Materials such as polysilicon, polycide, or metal silicide may be used for the contacts 172, 174, 176, and 182. In this manner, bases of adjacent devices may be linked within the device, rather than extrinsically.

FIG. 1(j) shows an overlapping contact structure in which polysilicon, polycide, or metal silicide 194 is used as the contact medium. The material 194 is grown over the oxide layer 20, and contacts the base region 80.

It should be noted that, while the structure shown in FIG. 1(f) is a bipolar structure, the technique described above may be equally applicable to forming a CMOS or complementary NPN-PNP transistor array.

An array with an optional CMOS configuration is shown in FIG. 2. A p-type Si film is epitaxially grown on a n+ Si blanket subcollector 202, whereby, after the process is completed, a plurality of n-type regions 208 are formed, using the above-described selective epitaxial process (FIGS. 1(a)-(e)) which form the device regions in PMOS devices. The remaining p regions of the original p epitaxial layer are used to fabricate NMOS devices. Thereafter, the original thick oxide layer overlay (oxide layer in FIG. 1(a)) is stripped. The wafers then are cleaned, and then conventional methods are used to fabricate the PMOS and NMOS devices in their appropriate respective regions to form the CMOS circuitry. The formation of gate contacts 290, 292, and contacts 284, 286, 294, and 296 also may be carried out by known techniques. At the far left of FIG. 2, the additional p+-type region 240 shown may be grown to provide a CMOS structure.

Preferred dopant concentration ranges for the various regions shown in FIG. 2 are as follows:

n: $10^{14}$–$10^{17}$/cm$^3$
p: $10^{14}$–$10^{17}$/cm$^3$
n+: $5 \times 10^{19}$–$5 \times 10^{20}$/cm$^3$
p+: $5 \times 10^{19}$–$5 \times 10^{20}$/cm$^3$ Again, it should be clear to the ordinarily skilled artisan that, given the desired dopant concentration ranges, and the desired device characteristics, it should be possible to determine how the various doping and growth techniques should be applied, without undue experimentation.

The method of the invention now will be described as applied to a complementary vertical NPN and PNP device structure, as shown in FIGS. 3(a)-3(f). By employing selective epitaxial growth and ion implantation techniques as described below, high-performance devices may be fabricated.

Figure 3A:
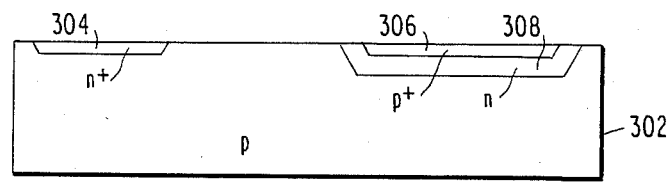
FIGS. 3(a)–(f) illustrate a second type of structure employing the method of the invention, and steps in the formation of the structure.

In FIG. 3(a), in a p-type monocrystalline silicon substrate 302 having a preferred dopant concentration ranging from $10^{14}$–$5 \times 10^{15}$/cm$^3$, n+ and p+ subcollectors 304 and 306 are respectively formed by conventional ion implantation and dopant drive-in methods. The n+ and p+ subcollectors preferably are doped in a range from $10^{19}$–$10^{20}$/cm$^3$. When the p+ subcollector is formed, an isolation layer 308 of n-type material having a preferred dopant concentration in a range from $5 \times 10^{17}$–$5 \times 10^{18}$/cm$^3$ also is formed by a double implant.

Figure 3B:
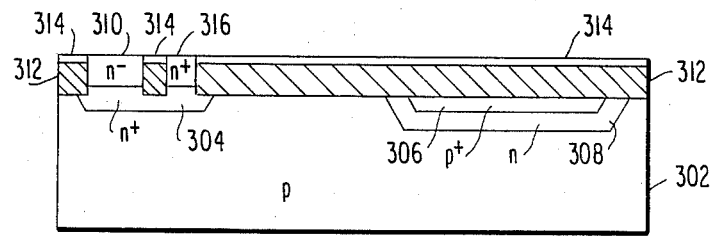

Next, as shown in FIG. 3(b), an oxide layer 312 of 500 nanometer–2 micron thickness, is grown over and partially into the substrate and subcollector structure. A thin Si$_3$N$_4$ layer 314 may be grown over the oxide layer 312. Openings (not numbered) are selectively etched out of this oxide layer. These openings, in which selective epitaxial growth will be carried out, are to be used to form the NPN transistor. Then, n− region 310 and n+ reachthrough region 316 are selectively grown for the NPN transistor. The preferred dopant concentration range for region 310 is $5 \times 10^{15}$–$10^{18}$/cm$^3$. The high dopant concentration in the region 316 (i.e. in the same range as for subcollector 304) may be achieved by selective ion implantation.

Figure 3C:
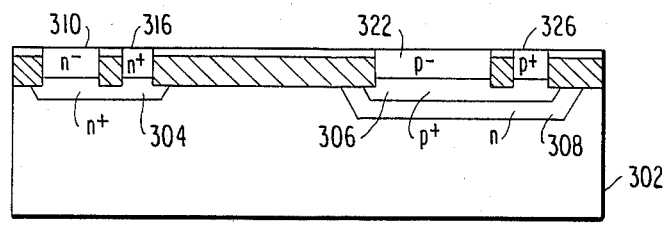

In FIG. 3(c), a similar procedure is carried out for the PNP transistor. Before doing so, the device regions 310, 316 are covered with an appropriate masking layer, such as SiO$_2$ (not shown). Openings (not numbered) are selectively etched from the oxide layer. Then, p− region 322 and p+ reach-through region 326 are selectively grown. The preferred dopant concentration range for region 322 is the same as that for region 310. Again, the high dopant concentration in the region 326 (in the same range as region 306) may be achieved by selective ion implantation.

At this point, it should be noted that the selective etching of the oxide layer 312 and nitride layer 314 has resulted in the formation of isolation portions which are as effective as the prior art technique of trench digging and refilling, but which instead are formed in a single step, rather than in separate process steps. It should also be understood that the implementation of isolation 308 and subcollector 306 (see FIG. 3(a)) of the PNP transistor can be deferred until the oxide opening for the PNP transistor is etched to achieve self-alignment.

Figure 3D:
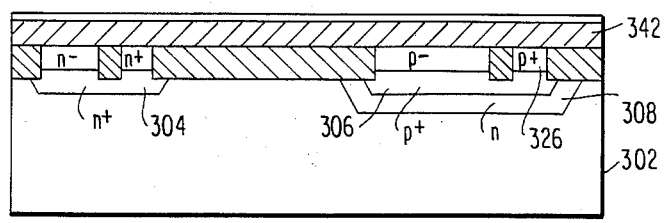
Figure 3E:
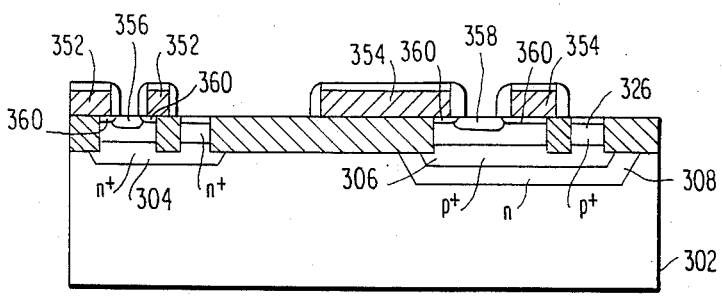

FIG. 3(d) shows the next steps in the process, in which, after planarizing the surface of the structure by a method such as chem-mech polishing, a layer 342 of undoped polysilicon is deposited on the planarized surface. This layer 342 also may be polycide, or metal silicide. Then, this layer is first selectively doped by ion implantation, and then selectively etched away, leaving only portions which are to form the extrinsic base portions for the NPN and PNP transistors. These base portions are appropriately doped by arsenic or boron ion implantation, as appropriate. The resulting p+ regions 352 and n+ regions 354 are shown in FIG. 3(e). Preferred dopant concentration ranges for these extrinsic base portions are the same as for the regions 304, 306.

After the extrinsic base portions are formed, the extrinsic base isolation sidewall spacers 360 (of SiO$_2$) are formed. The intrinsic base portions are formed, again by selective arsenic or boron ion implantation, yielding dopant concentrations in a preferred range of $10^{17}$–$5 \times 10^{18}$/cm$^3$. These p and n regions 356, 358, respectively, also are shown in FIG. 3(e). At the same time, the extrinsic and intrinsic bases are linked, and the intrinsic base dopant profiles are set up. This may be performed by carrying out a dopant drive-in anneal.

Figure 3F:
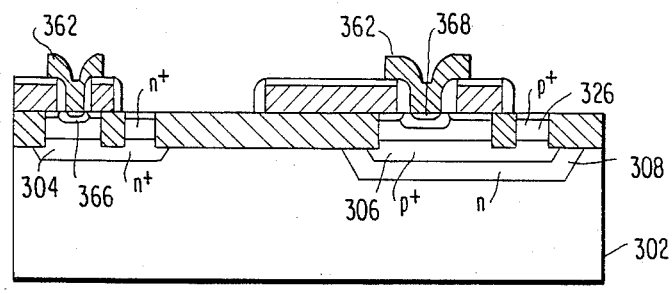

Finally, in FIG. 3(f), emitter plates 366, 368 are formed for the NPN and PNP transistors, respectively. A polysilicon layer is deposited, selectively ion implanted, and delineated appropriately, in a manner similar to the formation of the extrinsic base plates. To form emitter diffusion, an emitter dopant drive-in anneal is carried out. Conventional methods then are employed to complete the fabrication. Optionally, an emitter ion implantation may also be carried out before implementation of emitter plate 366.

Figure 4A:
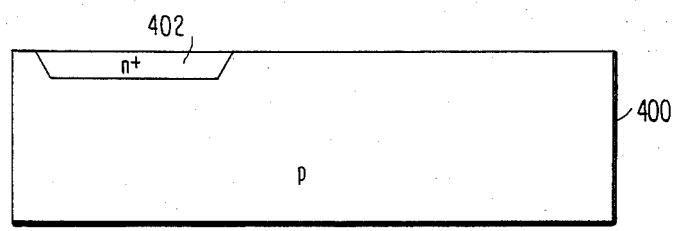
FIGS. 4(a)–(i) illustrate a third type of structure fabricated according to the invention, and intermediate fabrication steps.

FIGS. 4(a)-(i) illustrate the method of the invention as applied to the formation of bipolar MOS (BIMOS) integrated circuits. In FIG. 4(a), a n+ subcollector 402 (having a preferred dopant concentration in a range from $10^{19}$–$2 \times 10^{20}$/cm$^3$) is formed in a p type substrate 400 (having a preferred dopant concentration in a range from $10^{14}$–$10^{16}$/cm$^3$), by conventional techniques, such as planar diffusion or ion implantation. The subcollector 402 may be from 200 nanometers to one micron thick.

Figure 4B:
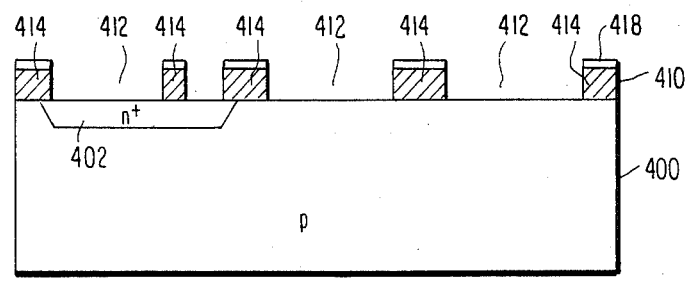

FIG. 4(b) shows the definition of the device regions 412. In order to form the device regions, an SiO$_2$ layer 410 is grown over the substrate, and is selectively etched away, leaving oxide walls 414. When fabrication is completed, these oxide walls 414 will effectively correspond to oxide-filled isolation trenches. An $Si_3N_4$ layer 418 is optionally deposited over the oxide layer 410 in order to facilitate wafer planarization in later processing stages. As was the case with the structure of FIGS. 3(a)-(f), the regions 412 may be between 200 nanometers and two microns deep.

Figure 4C:
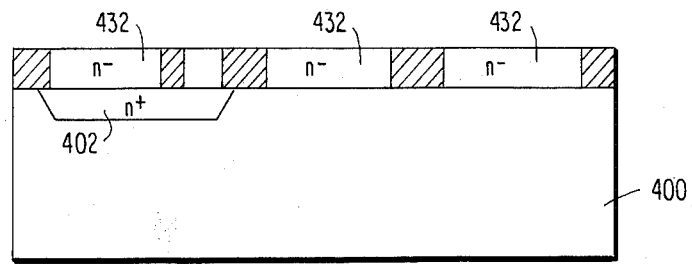
Figure 4D:
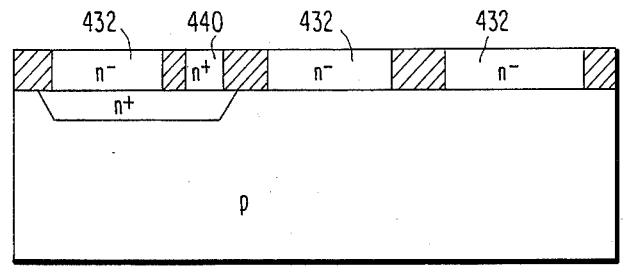

In FIG. 4(c), Si is selectively epitaxially grown in the regions 412. For an NPN transistor, n− epi is grown; for a PNP transistor, p− epi may be grown. The epitaxially grown regions 432 are doped in concentrations between $10^{14}$ and $5 \times 10^{15}/cm^3$. If necessary, the wafer surface is planarized by a known technique, such as chem-mech polishing. Then, the $Si_3N_4$ overlay is removed. Then, as shown in FIG. 4(d), and n+ reachthrough 440 is formed by, for example, selective ion implantation and dopant drive-in. The reachthrough 440 should have a dopant concentration in a range comparable to that of subcollector 402.

Figure 4E:
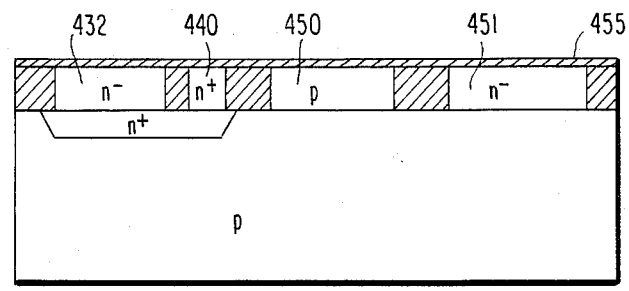
Figure 4F:
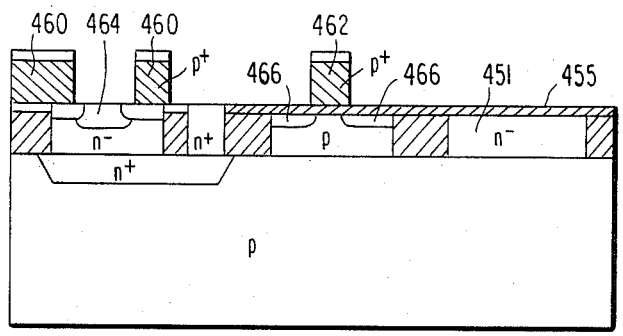

In FIG. 4(e), one of the regions reserved for n− epi growth is converted to p doping by boron ion implantation, or another suitable technique for NMOS fabrication. The region 450, being doped to a concentration of $10^{15}-10^{16}$, results. Then, a thin oxide layer 455 of desired thickness (e.g. from 5 to 200 nanometers) is grown. This thin oxide is selectively removed by, e.g. BHF, as described above with respect to FIG. 2, from the bipolar device region 432. Then, as shown in FIG. 4(f), a p+ extrinsic base plate (for an NPN transistor; n+ for a PNP transistor) 460 having a dopant concentration in a preferred range similar to that of subcollector 402, and a preferred height of 200-600 nanometers, is formed by depositing p+ (or n+) polysilicon, polycide, or refractory metal silicide, and delineating it appropriately. The gate 462 for the NMOS transistor also is formed in this manner.

Figure 4G:
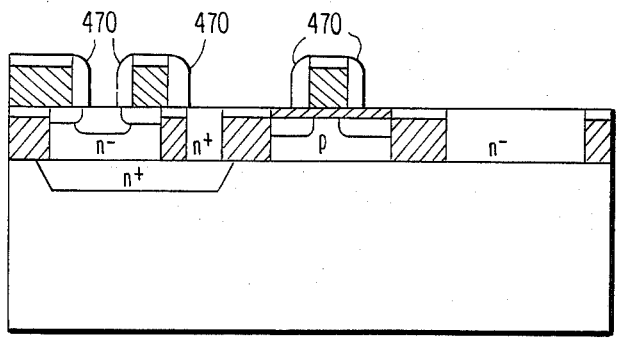

Also in FIG. 4(f), after the extrinsic base 460 of the bipolar transistor and the gate 462 of the NMOS transistor have been formed, a p ion implantation (to a dopant concentration in a range comparable to that of the region 432 of the NPN transistor to form the intrinsic base 464. An n− ion implantation is carried in the NMOS regions 450 of the n-channel FET to form the n-light-doped drain (LDD) regions 466 of the transistor. Dopant concentrations in regions 466 are in a range of $10^{16}-10^{18}/cm^3$. In FIG. 4(g), $SiO_2$ sidewall spacers 470 are formed on the extrinsic base plate 460 and the gate 462.

Figure 4H:
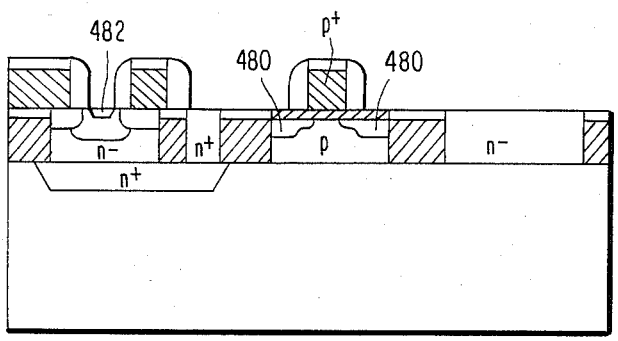
Figure 4I:
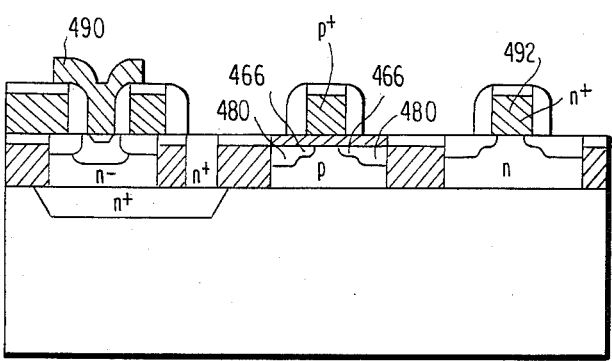

In FIG. 4(h), an n+ source and drain 480 is formed for the NMOS transistor. The desired dopant concentrations are in a range of $5 \times 10^{19}-5 \times 10^{20}/cm^3$. The n+ emitter 482 of the NPN transistor optionally may be formed in this step. In FIG. 4(i), a second layer of polysilicon or ploycide, which is n+ doped, is put down. This layer includes the emitter plate 490 for the NPN transistor, and the gate 492 for the PMOS transistor. The device may be finished in a conventional manner.

It should be noted that the subcollector reachthrough 440 shown in FIG. 4(d) and following may be formed by ordinary thermal diffusion, or by ion implantation.

The above method has been described with fabrication techniques tailored for working with silicon. However, with appropriate modification, which would be within the ability of the ordinarily skilled artisan, the method and resulting structures described above can be achieved using gallium arsenide (GaAs) as the primary semiconductor material.

What is claimed is:

1. A method of fabricating dielectrically isolated integrated circuit devices, comprising the following steps:
   (i) forming a plurality of subcollector regions in a monocrystalline silicon substrate having upper and lower portions, said step (i) including the step of doping said upper portion of said substrate in accordance with types of devices to be formed, said lower portion of said substrate forming said subcollector regions, said step (i) further including the following steps:
   (i)(a) forming a masking layer over said substrate;
   (i)(b) etching a plurality of holes in said masking layer; and
   (i)(c) anisotropically etching a plurality of active device regions in said substrate through said holes;
   (ii) growing an oxide layer in said active device regions over portions of said substrate where said devices are to be formed;
   (iii) etching first regions in said oxide layer over said subcollector regions by anisotropically etching a self-aligned hole in said oxide layer in each of said active device regions, said self-aligned hole being directly beneath a corresponding one of said holes in said masking layer; and
   (iv) forming said devices by selective epitaxial growth at least in said first regions.

2. A method as claimed in claim 1, wherein said step (iii) comprises the step of etching said first regions through said upper portion of said substrate to contact said lower portion of said substrate.

3. A method as claimed in claim 1, wherein said step (iii) comprises the step of etching said first regions through said upper portion of said substrate and into said lower portion of said substrate.

4. A method as claimed in claim 1, wherein said step (iv) further comprises the following steps:
   (iv) (a) filling said active device regions by selective epitaxial growth; and
   (iv) (b) forming remaining active elements of said integrated circuit devices in accordance with a type of device to be formed.

5. A method as claimed in claim 4, wherein said step (iv) further comprises the step of growing said devices in said active device regions and in said first regions, said step (iv) further comprising the step of selectively epitaxially growing a collector, a base, and an emitter through each of said holes in said masking layer, whereby a vertically self-aligned symmetrical transistor structure is achieved, a collector-base junction and a base-emitter junction covering equal areas.

6. A method as claimed in claim 5, wherein said collectors are grown by out-diffusing said subcollectors regions into said active device regions.

7. A method as claimed in claim 4, further comprising the following step:
   (v) forming complementary devices between said devices formed in said active device regions, said complementary devices being dielectrically isolated from said devices formed in said active device regions by said oxide layers,
   said upper portion of said substrate being doped in a manner opposite to the doping of said base grown in each of said active device regions.

8. A method as claimed in claim 4, wherein said step (iv) (b) further comprises the step of forming a base region of said devices wider than said self-aligned hole, said method further comprising the step of forming a base contact through said masking layer into said base region, whereby contact to said base region may be established on an upper surface of said devices.

9. A method as claimed in claim 8, further comprising the step of forming an appropriately doped portion in an upper region of said upper portion of said substrate adjacent said oxide layer outside said base region, whereby contact with said base region is established by connecting said appropriately-doped portion with said base contact.

10. A method as claimed in claim 8, further comprising the step of contacting said base contact on a surface of said devices.

* * * * *